US007381610B2

(12) United States Patent
Furukawa et al.

(10) Patent No.: US 7,381,610 B2
(45) Date of Patent: Jun. 3, 2008

(54) SEMICONDUCTOR TRANSISTORS WITH CONTACT HOLES CLOSE TO GATES

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 11/163,966

(22) Filed: Nov. 4, 2005

(65) Prior Publication Data

US 2007/0102766 A1 May 10, 2007

(51) Int. Cl.
*H01L 21/8238* (2006.01)
(52) U.S. Cl. .................. 438/229; 438/233; 438/299
(58) Field of Classification Search ........ 438/229–233, 438/299, 303, 304; 257/382–384, 900, E21.507
See application file for complete search history.

(56) References Cited

U.S. PATENT DOCUMENTS

| 5,897,349 | A | 4/1999 | Agnello |
| 6,136,696 | A | 10/2000 | Horiba |
| 6,174,756 | B1 | 1/2001 | Gambino et al. |
| 6,215,190 | B1 | 4/2001 | Bruce et al. |
| 6,232,647 | B1 | 5/2001 | Lien et al. |
| 6,274,467 | B1 | 8/2001 | Gambino et al. |
| 6,346,734 | B2 | 2/2002 | Divakaruni et al. |
| 6,350,661 | B2 | 2/2002 | Lim et al. |
| 6,372,569 | B1 | 4/2002 | Lee et al. |
| 6,432,787 | B1 | 8/2002 | Mandelman et al. |
| 6,501,131 | B1 | 12/2002 | Divakaruni et al. |
| 6,538,295 | B1 | 3/2003 | Bronner et al. |
| 6,638,805 | B2 * | 10/2003 | Park et al. ............... 438/233 |
| 6,884,715 | B1 | 4/2005 | Kwon et al. |
| 2001/0054729 | A1 | 12/2001 | Divakaruni et al. |
| 2003/0027395 | A1 | 2/2003 | Park et al. |

FOREIGN PATENT DOCUMENTS

| JP | 2003023117 | 1/2003 |
| JP | 2003077936 | 3/2003 |

\* cited by examiner

*Primary Examiner*—Hung Vu
(74) *Attorney, Agent, or Firm*—Schmeiser, Olsen & Watts; William D. Sabo

(57) ABSTRACT

A structure and a method for forming the same. The structure includes (a) a semiconductor layer including a channel region disposed between first and second S/D regions; (b) a gate dielectric region on the channel region; (c) a gate region on the gate dielectric region and electrically insulated from the channel region by the gate dielectric region; (d) a protection umbrella region on the gate region, wherein the protection umbrella region comprises a first dielectric material, and wherein the gate region is completely in a shadow of the protection umbrella region; and (e) a filled contact hole (i) directly above and electrically connected to the second S/D region and (ii) aligned with an edge of the protection umbrella region, wherein the contact hole is physically isolated from the gate region by an inter-level dielectric (ILD) layer which comprises a second dielectric material different from the first dielectric material.

7 Claims, 10 Drawing Sheets

SEMICONDUCTOR TRANSISTORS WITH CONTACT HOLES CLOSE TO GATES

BACKGROUND OF THE INVENTION

1. Technical Field

The present invention relates to semiconductor FETs (field effect transistors), and more specifically, to FETs with contact holes close to gates.

2. Related Art

During the fabrication of a typical FET (field effect transistor), after gate and source/drain (S/D) regions of the typical FET device are formed, a dielectric layer is deposited on top of the entire FET. Next, S/D contact holes are created in the dielectric layer and then filled with an electrically conducting material so as to provide electrical access to the S/D regions of the FET. As a result, to increase device density, there is a need for a transistor structure (and a method for forming the same) in which S/D contact holes are formed close to but electrically insulated from the gate of the transistor structure.

SUMMARY OF THE INVENTION

The present invention provides a structure formation method, comprising providing a structure including (a) a semiconductor layer including (i) a channel region and (ii) first and second source/drain (S/D) regions, wherein the channel region is disposed between and electrically coupled to the first and second S/D regions, (b) a gate dielectric region in direction physical contact with the channel region via an interfacing surface which defines a reference direction perpendicular to the interfacing surface, wherein the gate dielectric region is above the channel region in the reference direction, (c) a gate region in direct physical contact with the gate dielectric region, wherein the gate dielectric region is sandwiched between and electrically insulates the gate region and the channel region, and (d) a hard cap region on the gate region; forming a protection umbrella region from the hard cap region such that the gate region is completely in a shadow of the protection umbrella region, wherein the shadow of the protection umbrella region comprises a space shielded by the protection umbrella region from an imaginary light point source (i) directly above the protection umbrella region in the reference direction and (ii) infinitely far from the protection umbrella region; blanket depositing an inter-level dielectric (ILD) layer on the structure after said forming the protection umbrella region is performed; creating a contact hole in the ILD layer directly above the second S/D region and aligned with an edge of the protection umbrella region, wherein the contact hole is physically isolated from the gate region by the ILD layer; and filling the contact hole with an electrically conducting material.

The present invention also provides a structure formation method, comprising providing a structure including (a) a semiconductor layer including (i) a channel region and (ii) first and second source/drain (S/D) regions, wherein the channel region is disposed between and electrically coupled to the first and second S/D regions, (b) a gate dielectric region in direction physical contact with the channel region via an interfacing surface which defines a reference direction perpendicular to the interfacing surface, wherein the gate dielectric region is above the channel region in the reference direction, (c) a gate region in direct physical contact with the gate dielectric region, wherein the gate dielectric region is sandwiched between and electrically insulates the gate region and the channel region, and wherein the gate region comprises (i) a polysilicon region on and in direct physical contact with the gate dielectric region and (ii) first and second gate silicide regions on first and second sidewalls of the polysilicon region, respectively; (d) a hard cap region on the gate region; forming a protection umbrella region from the hard cap region such that the gate region is completely in a shadow of the protection umbrella region, wherein the shadow of the protection umbrella region comprises a space shielded by the protection umbrella region from an imaginary light point source (i) directly above the protection umbrella region in the reference direction and (ii) infinitely far from the protection umbrella region; blanket depositing an inter-level dielectric (ILD) layer on the structure after said forming the protection umbrella region is performed; creating a contact hole in the ILD layer directly above the second S/D region and aligned with an edge of the protection umbrella region, wherein the contact hole is physically isolated from the gate region by the ILD layer, and wherein said creating the contact hole comprises (i) forming an oxide layer on the ILD layer, (ii) creating an opening in the oxide layer, and, (ii) etching the ILD layer through the opening using the oxide layer and the protection umbrella region as a blocking mask; and filling the contact hole with an electrically conducting material.

The present invention also provides a structure, comprising (a) a semiconductor layer including (i) a channel region and (ii) first and second source/drain (S/D) regions, wherein the channel region is disposed between and electrically coupled to the first and second S/D regions; (b) a gate dielectric region in direction physical contact with the channel region via an interfacing surface which defines a reference direction perpendicular to the interfacing surface, wherein the gate dielectric region is above the channel region in the reference direction; (c) a gate region in direct physical contact with the gate dielectric region, wherein the gate dielectric region is sandwiched between and electrically insulates the gate region and the channel region; (d) a protection umbrella region on the gate region, wherein the protection umbrella region comprises a first dielectric material, and wherein the gate region is completely in a shadow of the protection umbrella region, wherein the shadow of the protection umbrella region comprises a space shielded by the protection umbrella region from an imaginary light point source (i) directly above the protection umbrella region in the reference direction and (ii) infinitely far from the protection umbrella region; and (e) a filled contact hole (i) directly above and electrically connected to the second S/D region and (ii) aligned with an edge of the protection umbrella region, wherein the contact hole is physically isolated from the gate region by an inter-level dielectric (ILD) layer, and wherein the ILD layer comprises a second dielectric material different from the first dielectric material.

The present invention provides a transistor structure (and a method for forming the same) in which S/D contact holes are formed close to but electrically insulated from the gate of the transistor structure.

DETAILED DESCRIPTION OF THE INVENTION

Figure 1A:
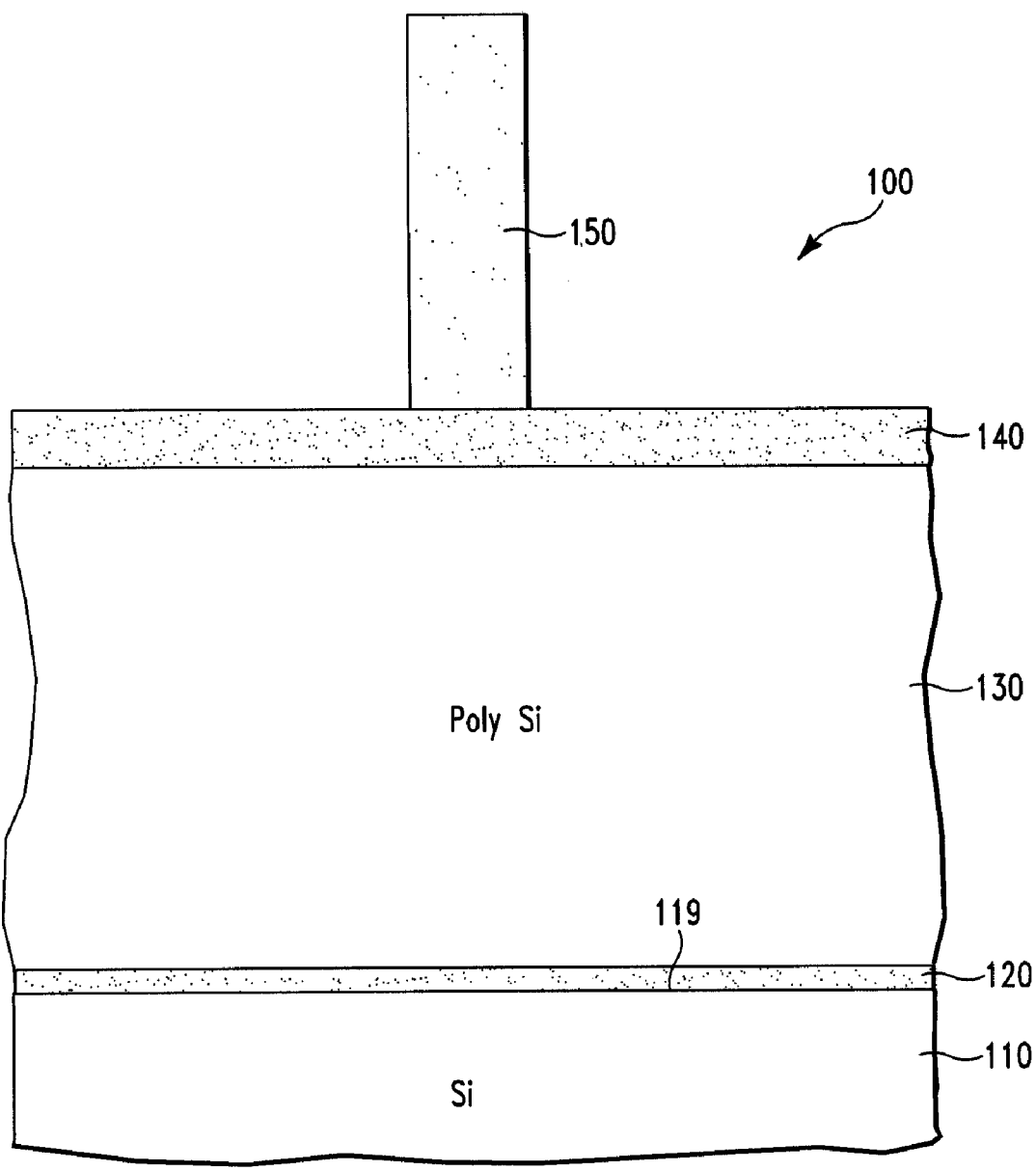
FIGS. 1A-1I illustrate the fabrication steps for forming a first FET, in accordance with embodiments of the present invention.

FIGS. 1A-1I illustrate the fabrication steps for forming a first FET 100, in accordance with embodiments of the present invention. More specifically, with reference to FIG. 1A, in one embodiment, the fabrication steps for forming the first FET 100 starts out with a semiconductor (e.g., silicon, germanium, etc.) substrate 110.

Next, in one embodiment, a gate dielectric layer 120 is formed on top of the Si substrate 110. Illustratively, the gate dielectric layer 120 comprises silicon dioxide ($SiO_2$) and is formed by oxidation of a top surface 119 of the Si substrate 110.

Next, in one embodiment, a gate layer 130 is formed on top of the gate dielectric layer 120. Illustratively, the gate layer 130 comprises polysilicon and is formed by chemical vapor deposition (CVD) of polysilicon on top of the gate dielectric layer 120.

Next, in one embodiment, an oxide hard mask layer 140 is formed on top of the polysilicon gate layer 130 by, illustratively, CVD of SiO2.

Next, in one embodiment, a patterned photoresist layer 150 is formed on top of the oxide hard mask layer 140 such that regions of the oxide hard mask layer 140 to be later removed are not covered by the patterned photoresist layer 150 while regions of the oxide hard mask layer 140 to remain are covered by the patterned photoresist layer 150. In one embodiment, the patterned photoresist layer 150 is formed using any conventional lithographic process.

Figure 1B:
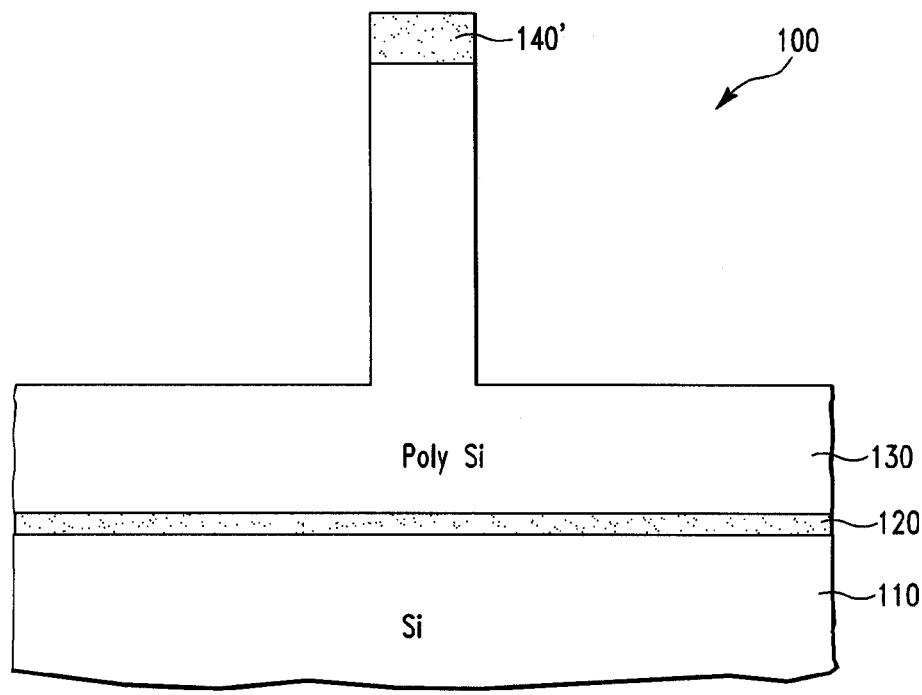

Next, in one embodiment, the patterned photoresist layer 150 is used as a blocking mask for a directional etching of (i) the oxide hard mask layer 140 and then (ii) the polysilicon gate layer 130. In one embodiment, the directional selective (i.e., using a blocking mask) etching of the polysilicon gate layer 130 is only partial (i.e., not completely through the polysilicon gate layer 130). The directional etching of the oxide hard mask layer 140 results in a patterned oxide hard cap 140' (FIG. 1B). Next, the patterned photoresist layer 150 is removed resulting in the structure 100 of FIG. 1B.

Figure 1C:
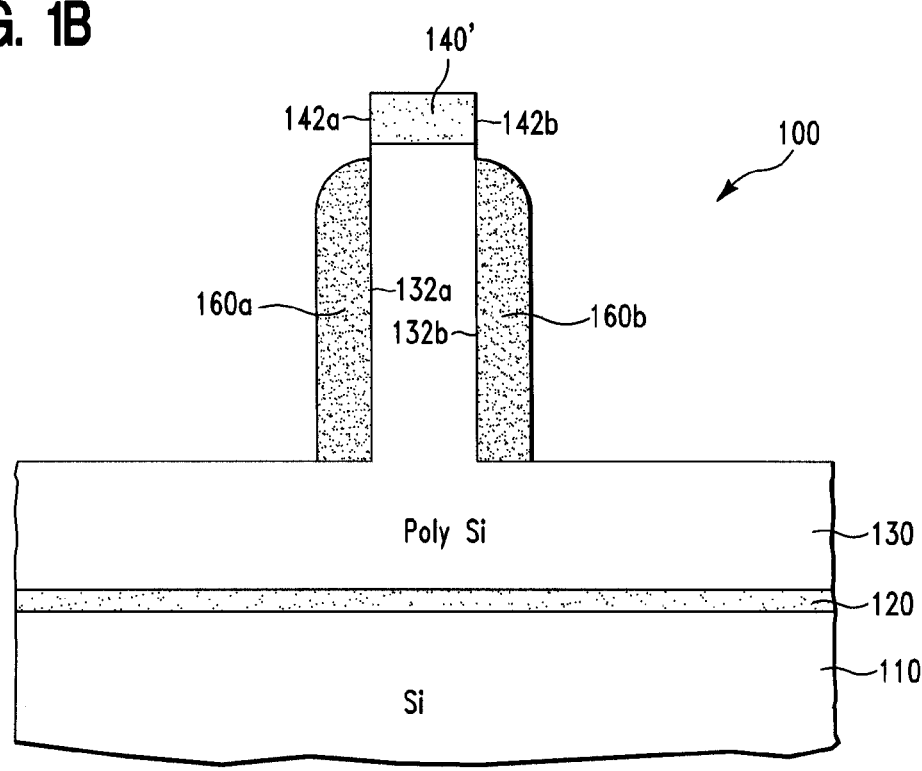

Next, in one embodiment, with reference to FIG. 1C, gate silicide spacers 160a and 160b are formed on sidewalls 132a and 132b of the polysilicon gate layer 130, respectively. Illustratively, the gate silicide spacers 160a and 160b comprise a metal silicide (such as tungsten silicide) and are formed by first (i) blanket depositing a conformal layer of tungsten silicide (not shown) on top of the structure 100 of FIG. 1B and then (ii) directionally etching the deposited tungsten silicide layer leaving the gate silicide spacers 160a and 160b on sidewalls 132a and 132b of the polysilicon gate layer 130, respectively, while removing the silicide from horizontal surfaces. In one embodiment, the step (ii) is performed such that sidewalls 142a and 142b of the oxide hard cap 140' are not covered by the silicide spacers 160a and 160b, respectively.

In the embodiments described above, the gate spacers 160a and 160b comprise tungsten silicide and are formed by blanket deposition of tungsten silicide followed by directional etching of the deposited tungsten silicide. In an alternative embodiment, the gate spacers 160a and 160b can comprise a metal and are formed by blanket deposition of the metal followed by directional etching of the deposited metal. In yet another alternative embodiment, the gate spacers 160a and 160b can comprise tungsten silicide (as described above) but are formed by (a) blanket deposition of tungsten on top of the structure 100 of FIG. 1B, (b) then heating the structure 100 to cause the deposited tungsten to chemically react with silicon to form tungsten silicide, then (c) removing unreacted tungsten, and then (d) directionally etching the formed tungsten silicide to remove tungsten silicide from horizontal surfaces leaving only the tungsten silicide gate spacers 160a and 160b on the sidewalls 132a and 132b of the polysilicon gate layer 130, respectively.

Figure 1D:
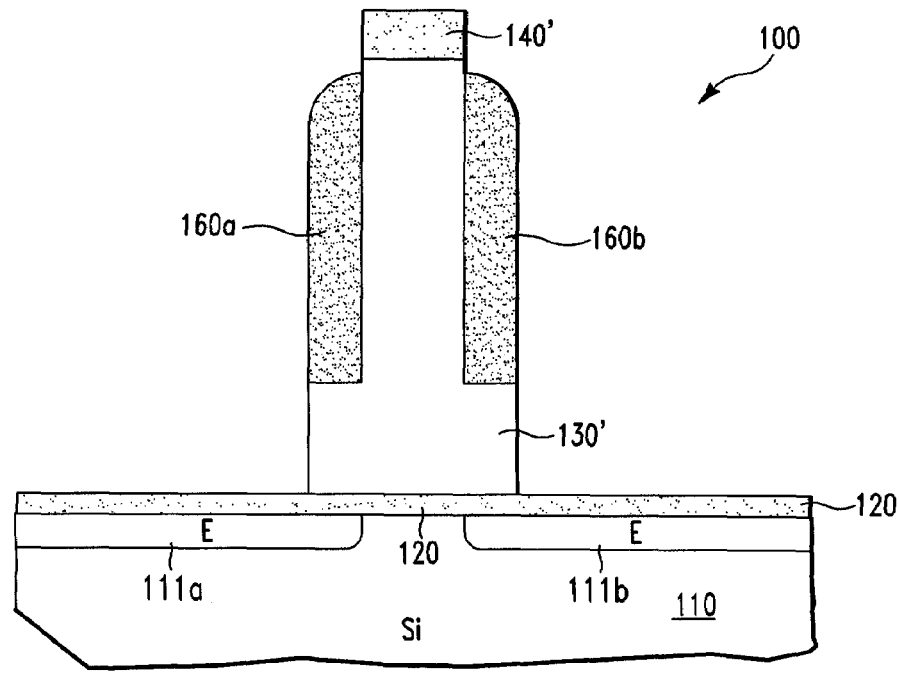

Next, with reference to FIG. 1D, in one embodiment, the gate silicide spacers 160a and 160b and the oxide hard cap 140' are used as a blocking mask for a directional etching of the polysilicon gate layer 130 stopping at the gate dielectric layer 120. As a result, what remains of the polysilicon gate layer 130 is a polysilicon gate region 130'. The combination of the polysilicon gate region 130', the oxide hard cap 140', and the gate silicide spacers 160a and 160b can be referred to as a gate stack 130',140',160a,160b, whereas the combination of the polysilicon gate region 130' and the gate silicide spacers 160a and 160b can be referred to as the gate region 130',160a,160b.

Next, in one embodiment, the gate stack 130',140',160a,160b is used as a blocking mask for forming source/drain (S/D) extension regions 111a and 11b, and halo regions (not shown for simplicity) in the Si substrate 110 on opposing sides of the gate stack 130',140',160a,160b. The formation of the S/D extension regions 111a and 111b and the halo regions can be by ion implantation.

Figure 1E:
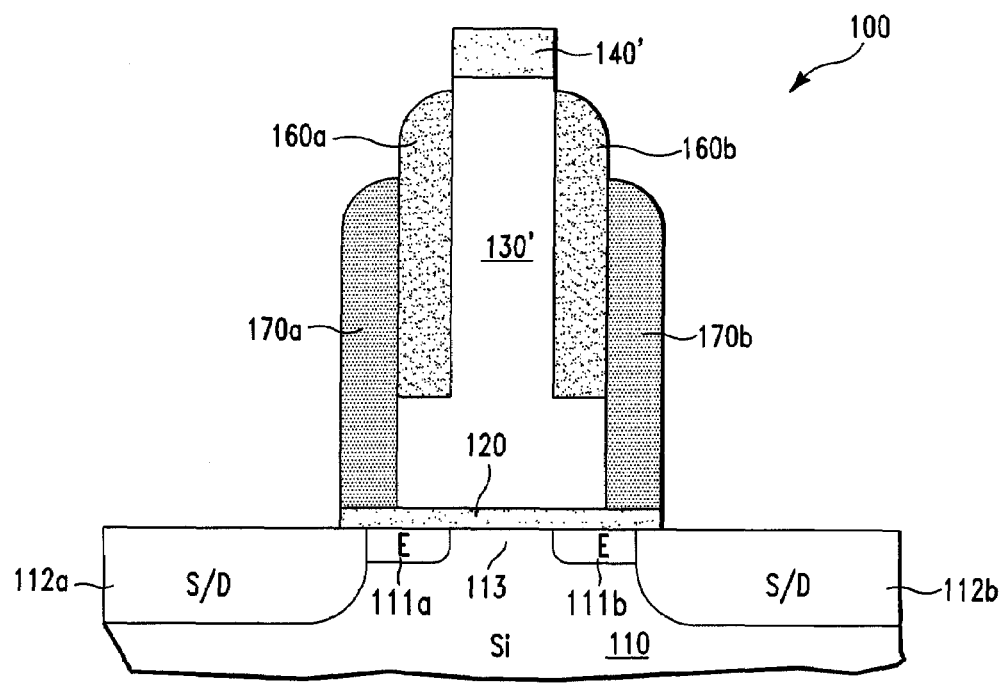

Next, with reference to FIG. 1E, in one embodiment, nitride spacers 170a and 170b are formed on sidewalls of the gate stack 130',140',160a,160b. Illustratively, the nitride spacers 170a and 170b are formed by (a) depositing a nitride spacer layer (not shown) on the entire structure 100 of FIG. 1D, and then (b) directionally etching the deposited nitride spacer layer resulting in the nitride spacers 170a and 170b on sidewalls of the gate stack 130',140',160a,160b. Said directional etching of the deposited nitride spacer layer typically also removes portions of gate dielectric layer 120 not masked by gate stack 130',140',160a,160b and nitride spacers 170a and 170b.

Next, in one embodiment, the nitride spacers 170a and 170b and the gate stack 130',140',160a,160b are used as a blocking mask for forming S/D regions 112a and 112b in the Si substrate 110 on opposing sides of the gate stack 130', 140',160a,160b. The formation of the S/D regions 112a and 112b can be by ion implantation followed by an anneal step.

The S/D extension region 111a and the S/D region 112a can be referred to as the S/D block 111a,112a. Similarly, the S/D extension region 111b and the S/D region 112b can be referred to as the S/D block 111b,112b. The S/D blocks 111a,112a and 111b,112b define a channel region 113 disposed between the S/D blocks 111a,112a and 111b,112b directly under the gate dielectric layer 120. The resulting structure 100 is depicted in FIG. 1E.

Figure 1F:
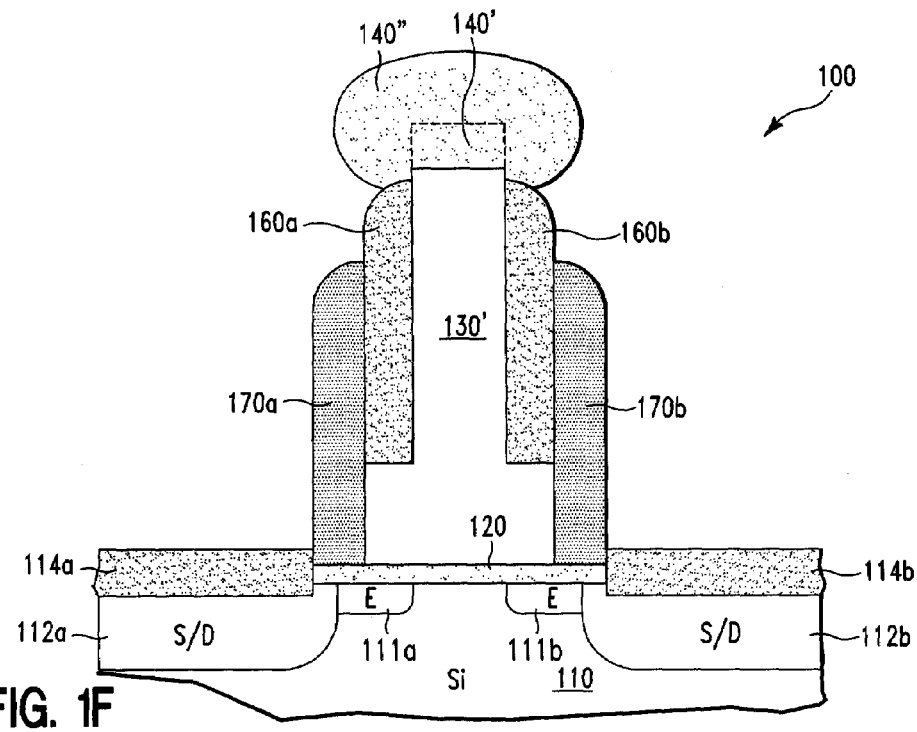

Next, with reference to FIG. 1F, in one embodiment, a protection umbrella region 140" is created from the oxide hard cap 140' such that the gate region 130',160a,160b is completely in a shadow of the protection umbrella region 140". Here, the shadow of the protection umbrella region 140" is defined to be a space shielded by the protection umbrella region 140" from an imaginary light point source (not shown) directly above and infinitely far from the protection umbrella region 140".

In one embodiment, the protection umbrella region 140" is formed by selectively depositing silicon dioxide only on the oxide hard cap 140' so as to enlarge the oxide hard cap 140'. The enlargement of the oxide hard cap 140' is continued until the gate silicide spacers 160a and 160b are completely in a shadow of the resulting protection umbrella region 140". In one embodiment, said selectively depositing silicon dioxide only on the oxide hard cap 140' involves (i) submerging the structure 100 of FIG. 1F in a solution of H$_2$SiF$_6$ (hexafluoro silicic acid) in H$_2$O, and then (ii) causing the solution to become over-saturated (by increasing the temperature of the solution in one embodiment) so as to create SiO2 that deposits on the oxide hard cap 140' resulting in the protection umbrella region 140". The chemical reaction that results from the over-saturation of the solution of H$_2$SiF$_6$ in H$_2$O is as follows.

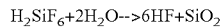
$$H_2SiF_6 + 2H_2O \rightarrow 6HF + SiO_2$$

It should be noted that the created SiO$_2$ deposits only on surfaces that have active hydroxyl groups "OH". As a result, the created SiO$_2$ deposits only on the SiO$_2$ surfaces of the oxide hard cap 140' (which have active hydroxyl groups) and not on silicide or nitride surfaces (which do not have active hydroxyl groups) of the regions 160a, 160b, 114a, 114b, 170a, and 170b. In one embodiment, the liquid-phase deposition of SiO$_2$ on only the SiO$_2$ surface to form protection umbrella region 140" described above can be carried out in conditions and equipment specified in U.S. Pat. No. 6,251,753, U.S. Pat. No. 5,232,781, and U.S. Pat. No. 6,653,245, which are hereby incorporated in this specification of the present invention.

Next, in one embodiment, S/D silicide regions 114a and 114b are formed on top of the S/D regions 112a and 112b, respectively, using any conventional process.

Figure 1G:
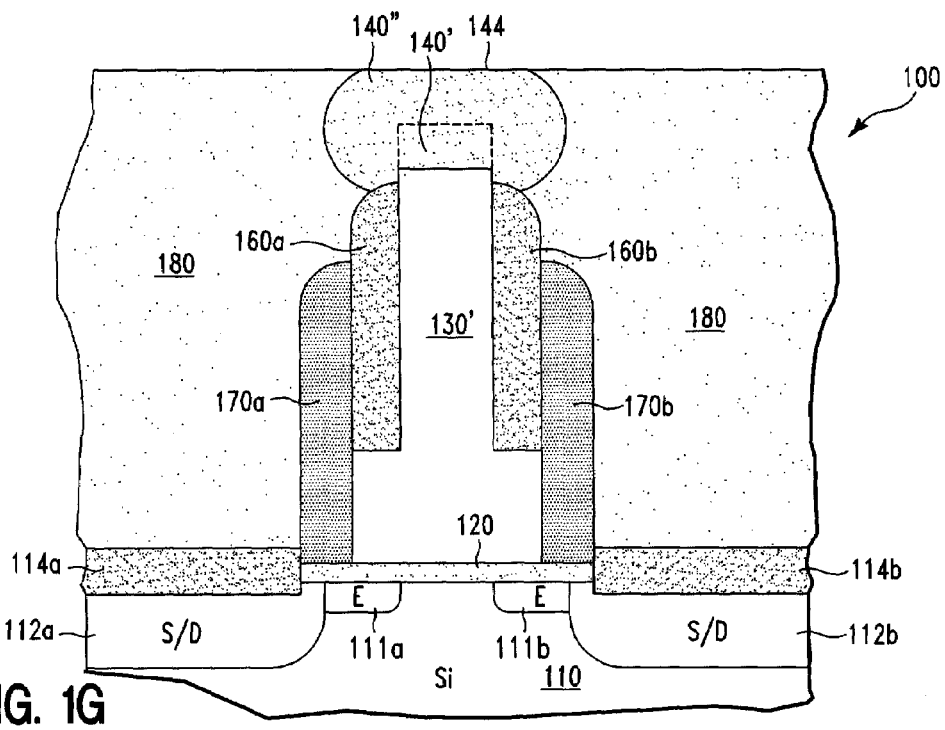

Next, with reference to FIG. 1G, in one embodiment, an inter-level dielectric (ILD) layer 180, comprising a low-K (i.e., K<3.5, wherein K is the dielectric constant) material in one embodiment, is formed on top of the structure 100 of FIG. 1F by, illustratively, a CVD or spin-on process. Next, in one embodiment, the low-K dielectric layer 180 is planarized until a top surface 144 of the protection umbrella region 140" is exposed to the surrounding ambient.

Figure 1H:
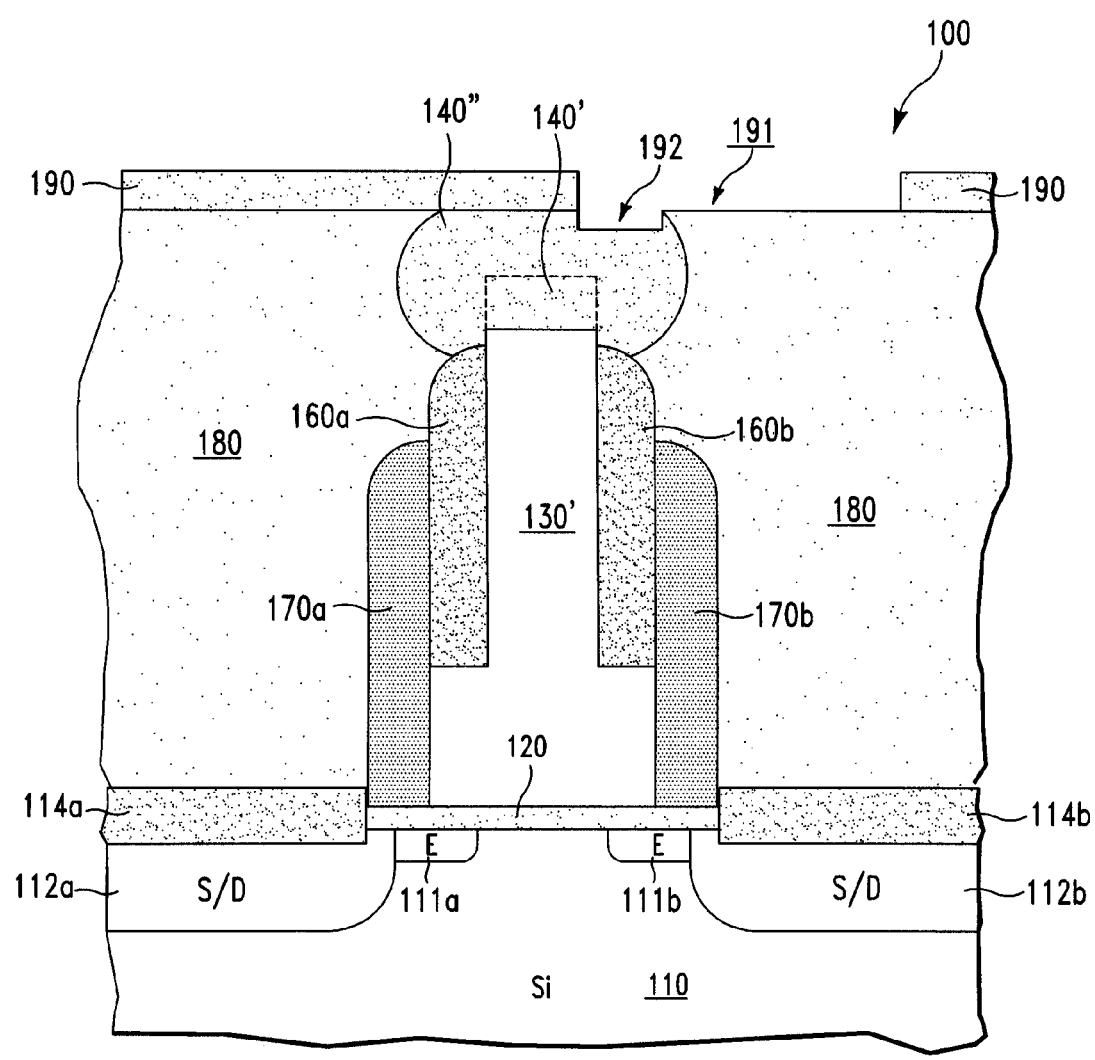

Next, with reference to FIG. 1H, in one embodiment, an oxide layer 190 is formed on top of the entire structure 100 of FIG. 1F. Next, an opening 191 is created in the oxide layer 190 by, illustratively, a conventional lithographic process. The creation of the opening 191 in the oxide layer 190 may result in an indentation 192 in the protection umbrella region 140" due to over-etching. In one embodiment, the indentation 192 is shallow such that no electrically conducting region of the gate stack 130',140',160a,160b is exposed to the surrounding ambient.

Figure 1I:
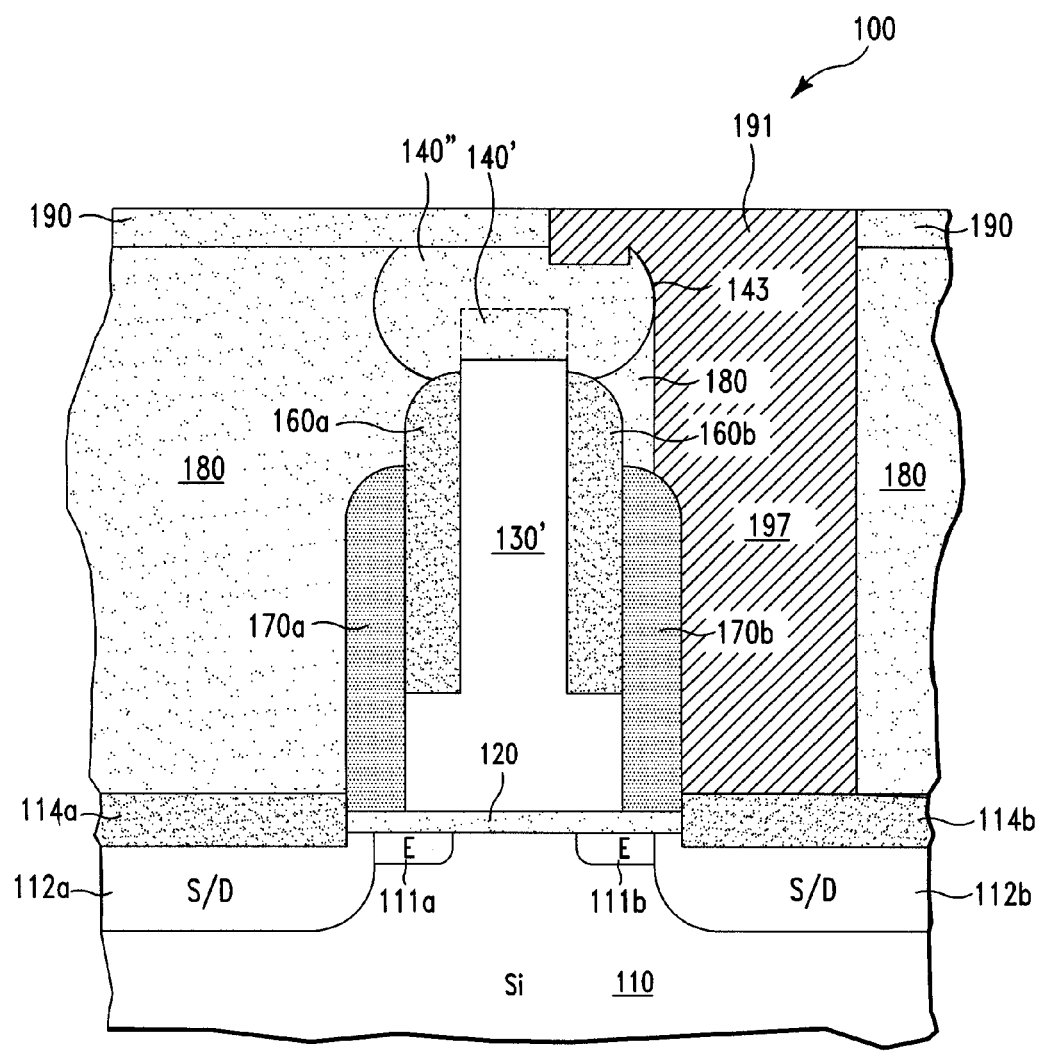

Next, with reference to FIG. 1I, in one embodiment, the oxide layer 190 and the protection umbrella region 140" are used as a blocking mask for a directional etching of the low-K dielectric layer 180 so as to create a contact hole 197 in the low-K dielectric layer 180 such that the S/D silicide region 114b is exposed to the surrounding ambient through the contact hole 197. In one embodiment, the relative position of the opening 191 in the oxide layer 190 with respect to the silicide spacer 160b is such that the contact hole 197 is formed aligned with an edge 143 of the protection umbrella region 140". Next, in one embodiment, the contact hole 197 is filled with an electrically conducting material (tungsten (W) in one embodiment) so as to provide electrical access to the S/D region 112b.

It should be noted that, because the gate region 130',160a,160b is completely in a shadow of the protection umbrella region 140", the silicide spacer 160b is not exposed to the surrounding ambient when the contact hole 197 is created in the low-K dielectric layer 180. As a result, the W-filled contact hole 197 is electrically insulated from the gate region 130',160a,160b (comprising regions 130', 160a, and 160b) by the low-K dielectric layer 180.

FIGS. 2A-2F illustrate the fabrication steps for forming a second FET 200, in accordance with embodiments of the present invention. More specifically, with reference to FIG. 2A, in one embodiment, the fabrication steps for forming the second FET 200 starts out with a structure similar to the structure 100 of FIG. 1A. For simplicity, all reference numerals herein have three numeric digits starting with the numeric figure number. In addition, similar regions have the identical reference numerals except for the first digit which is used to indicate the numeric figure number. For example, the substrate 110 (FIG. 1A) and the substrate 210 (FIG. 2A) are similar.

Figure 2A:
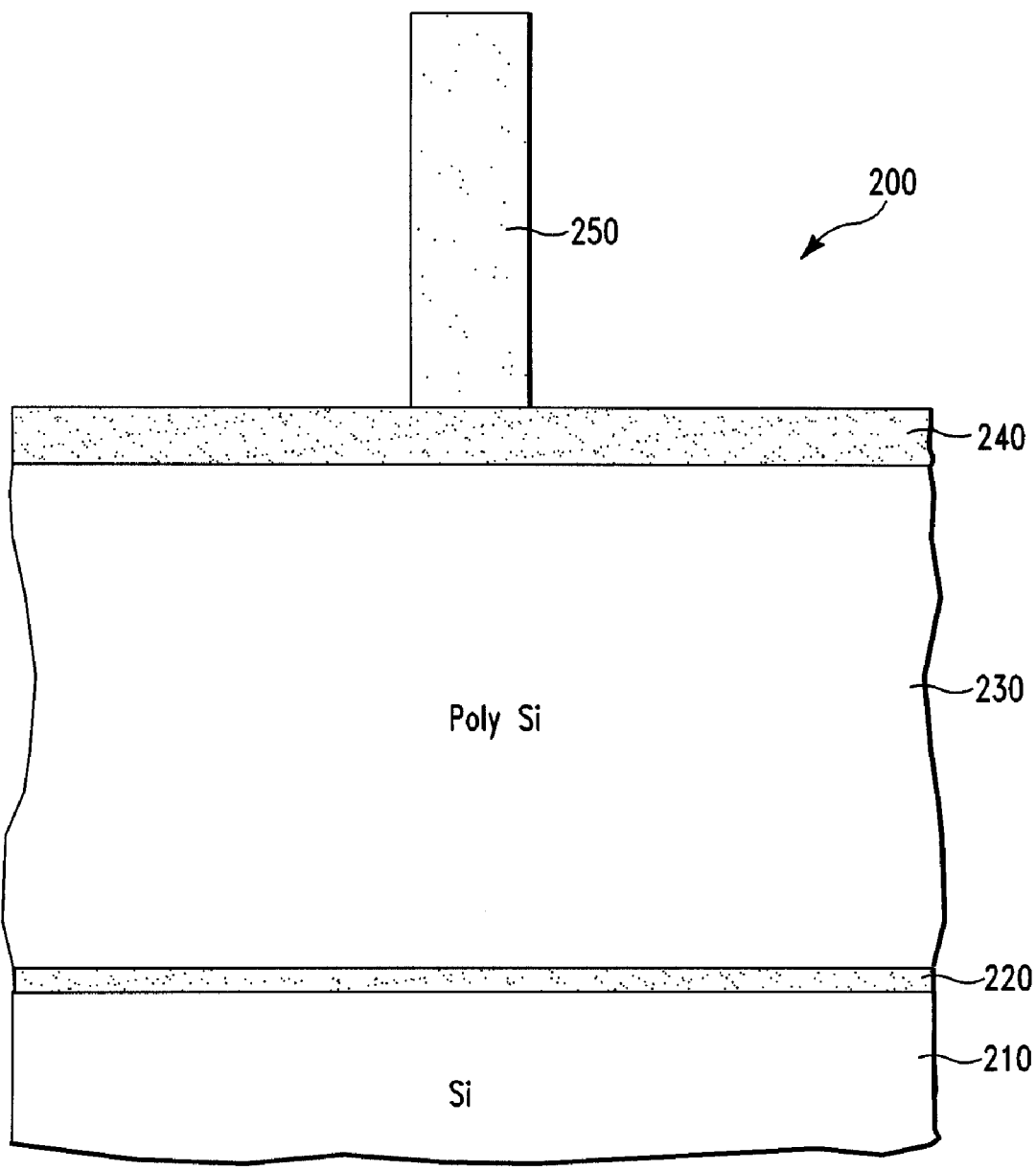
FIGS. 2A-2F illustrate the fabrication steps for forming a second FET in accordance with embodiments of the present invention.
Figure 2B:
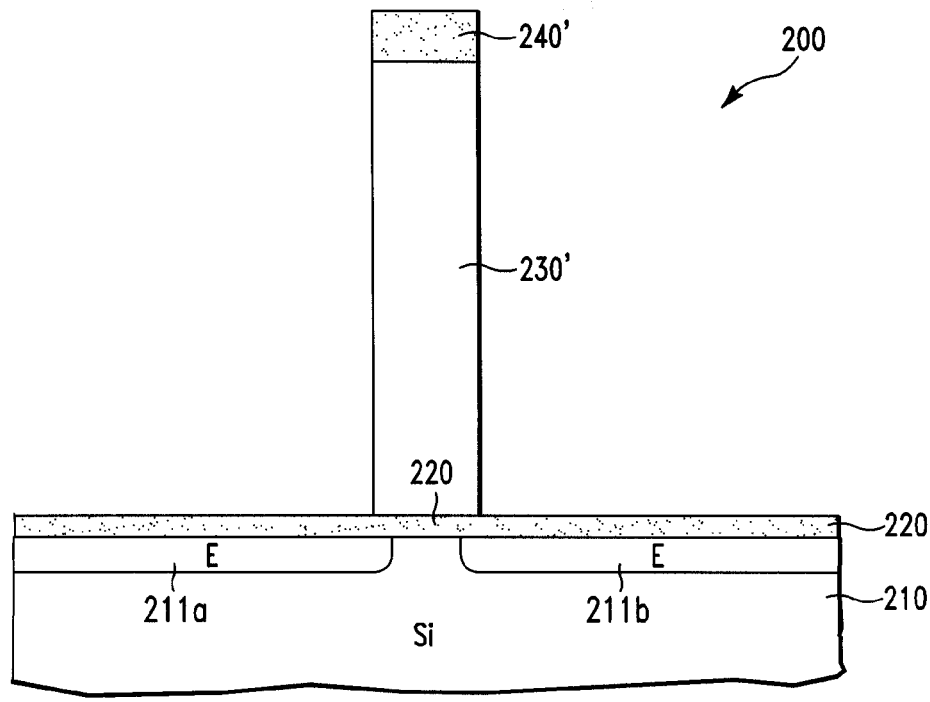

Next, in one embodiment, the patterned photoresist layer 250 is used as a blocking mask for a directional etching of (i) the oxide hard mask layer 240 and then (ii) the polysilicon gate layer 230 stopping at the gate dielectric layer 220. The directional selective (i.e., using a blocking mask) etching of the oxide hard mask layer 240 and the polysilicon gate layer 230 results in an oxide hard cap 240' and a polysilicon gate region 230' (FIG. 2B). Next, the patterned photoresist layer 250 is removed resulting in the structure 200 of FIG. 2B. With reference to FIG. 2B, the oxide hard cap 240' and the polysilicon gate region 230' can be referred to as a gate stack 230',240'.

Next, in one embodiment, the gate stack 230',240' is used as a blocking mask for forming source/drain (S/D) extension regions 211a and 211b and halo regions (not shown for simplicity) in the Si substrate 210 on opposing sides of the gate stack 230',240'. The formation of the S/D extension regions 211a and 211b and halo regions can be by ion implantation.

Figure 2C:
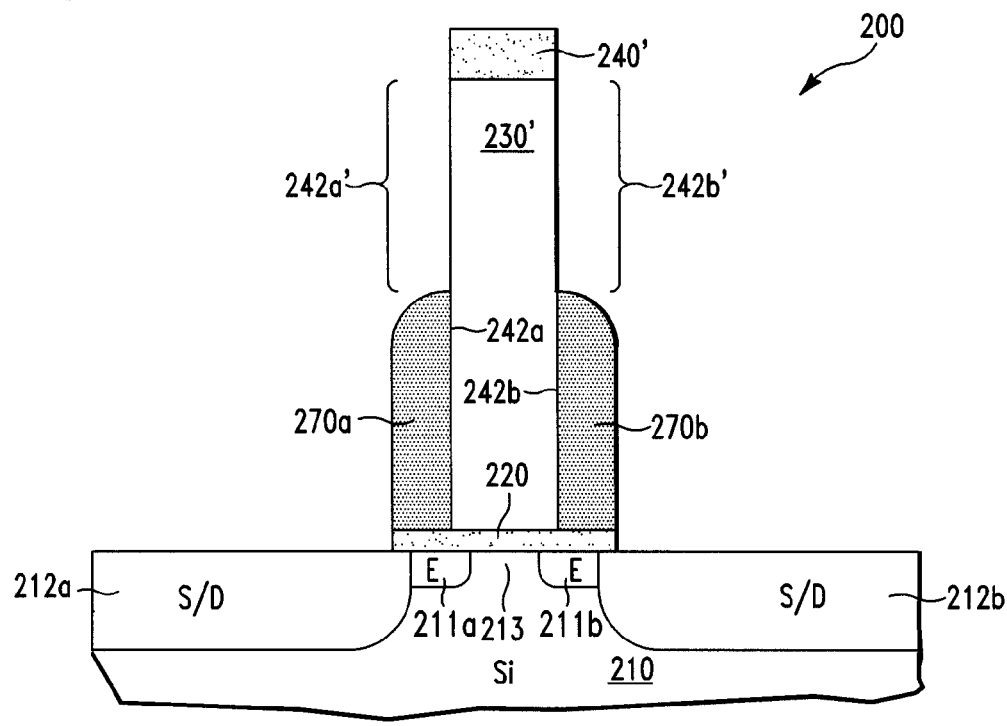

Next, with reference to FIG. 2C, in one embodiment, nitride spacers 270a and 270b are formed on sidewalls 242a and 242b of the polysilicon gate region 230', respectively. Illustratively, the nitride spacers 270a and 270b are formed by (a) depositing a nitride spacer layer (not shown) on the entire structure 200 of FIG. 2B, and then (b) directionally etching the deposited nitride spacer layer resulting in the nitride spacers 270a and 270b. In one embodiment, said directionally etching of the deposited nitride spacer layer is performed such that sidewall portions 242a' and 242b' of the sidewalls 242a and 242b, respectively, of the polysilicon gate region 230' are exposed to the surrounding ambient (i.e., not covered by the nitride spacers 270a and 270b). Said directional etching of the deposited nitride spacer layer typically also removes portions of gate dielectric layer 220 not masked by gate stack 230',240',260a,260b and nitride spacers 270a and 270b.

Next, the nitride spacers 270a and 270b and the gate stack 230',240' are used as a blocking mask for forming S/D regions 212a and 212b in the Si substrate 210 on opposing sides of the gate stack 230',240'. The formation of the S/D regions 212a and 212b can be by ion implantation followed by an anneal process.

The S/D extension region 21/a and the S/D region 212a can be referred to as the S/D block 211a,212a. Similarly, the S/D extension region 211b and the S/D region 212b can be referred to as the S/D block 211b,212b. The S/D blocks 211a,212a and 211b,212b define a channel region 113 disposed between the S/D blocks 211a,212a and 211b,212b directly under the gate dielectric layer 120.

Figure 2D:
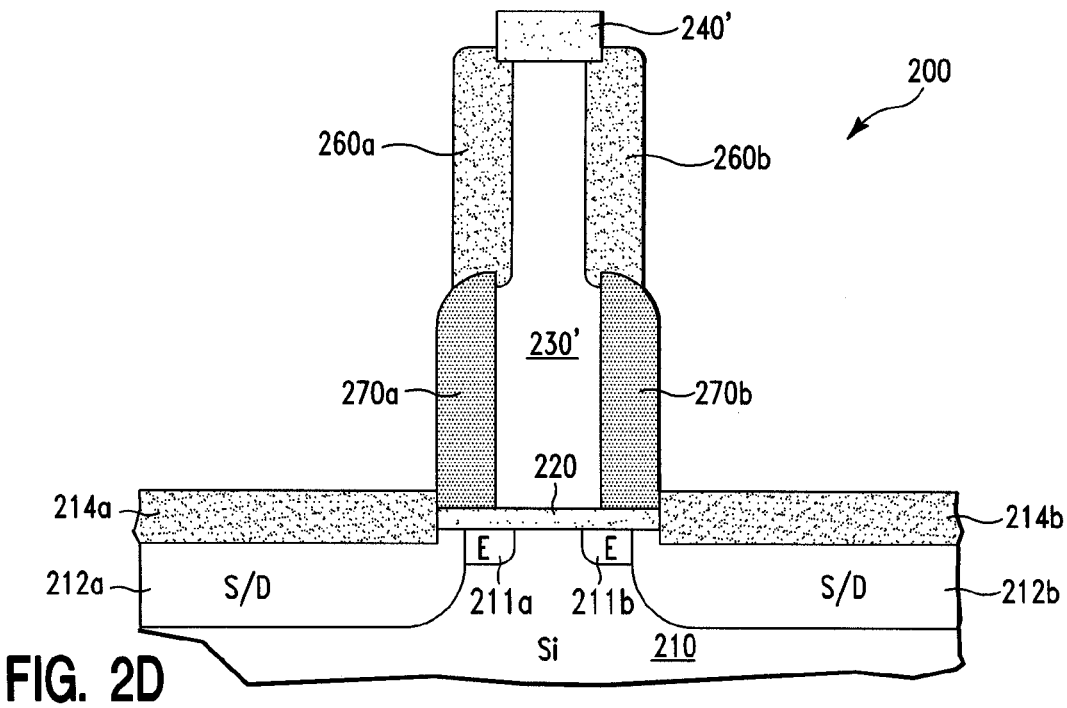

Next, with reference to FIG. 2D, in one embodiment, gate silicide regions 260a and 260b are formed on exposed-to-ambient sidewall portions 242a' and 242b' (FIG. 2C) of the polysilicon gate region 230', respectively, while S/D silicide regions 214a and 214b are formed on the S/D regions 212a and 212b, respectively. In one embodiment, the gate silicide regions 260a and 260b and the S/D silicide regions 214a and 214b are formed by (i) depositing a metal layer (not shown) on top of the entire structure 200 of FIG. 2C, and then (ii) annealing (heating) the structure 200 at a high temperature so as to cause the metal of the deposited metal layer to chemically react with silicon to form the gate silicide regions 260a and 260b and the S/D silicide regions 214a and 214b. Finally, unreacted metal of the deposited metal layer is removed by, illustratively, a wet etch step, resulting in the structure 200 of FIG. 2D. The combination of the polysilicon gate region 230' and the gate silicide spacers 260a and 260b can be referred to as the gate region 230',260a,260b.

Figure 2E:
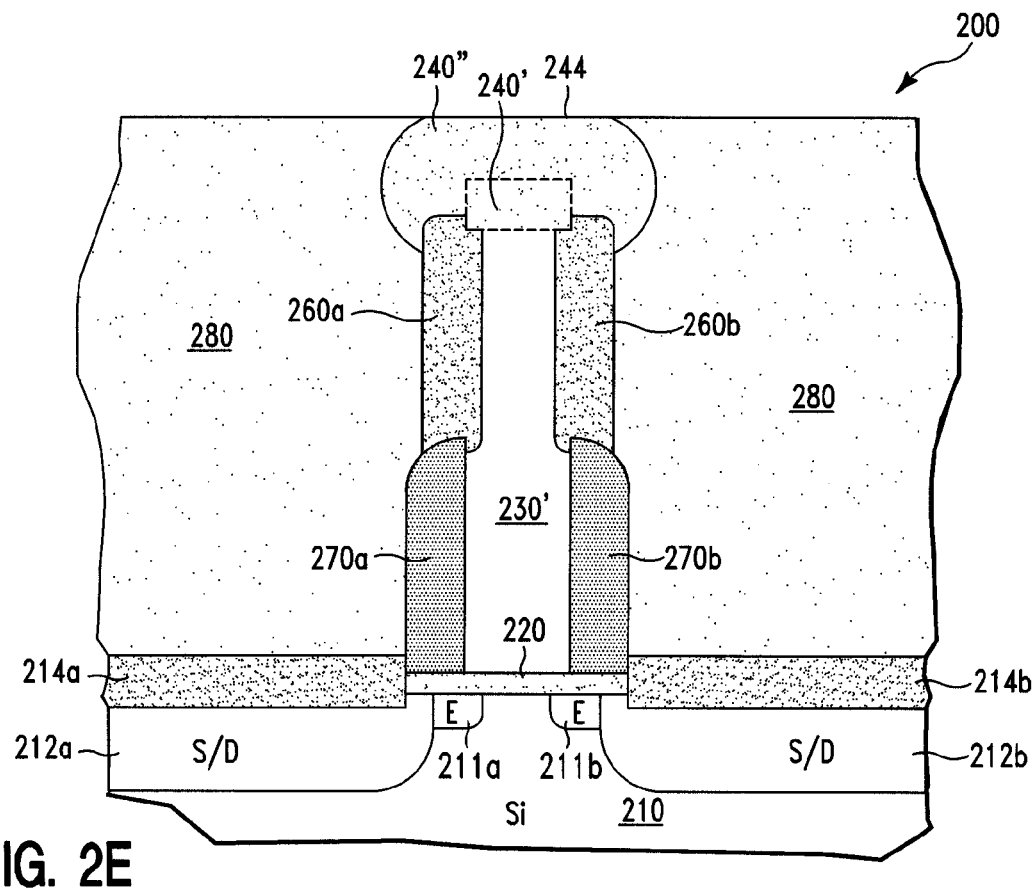

Next, with reference to FIG. 2E, in one embodiment, a protection umbrella region 240" is created from the oxide hard cap 240' such that the gate region 230',260a,260b is completely in a shadow of the protection umbrella region 240". In one embodiment, the formation of the protection umbrella region 240" is similar to the formation of the protection umbrella region 140" of FIG. 1F.

Next, in one embodiment, an ILD layer 280, comprising a low-K (i.e., K<3.5, wherein K is the dielectric constant) material in one embodiment, is formed on top of the structure 200 by, illustratively, a CVD or spin-on process. Next, in one embodiment, the low-K dielectric layer 280 is planarized until a top surface 244 of the protection umbrella region 240" is exposed to the surrounding ambient.

Figure 2F:
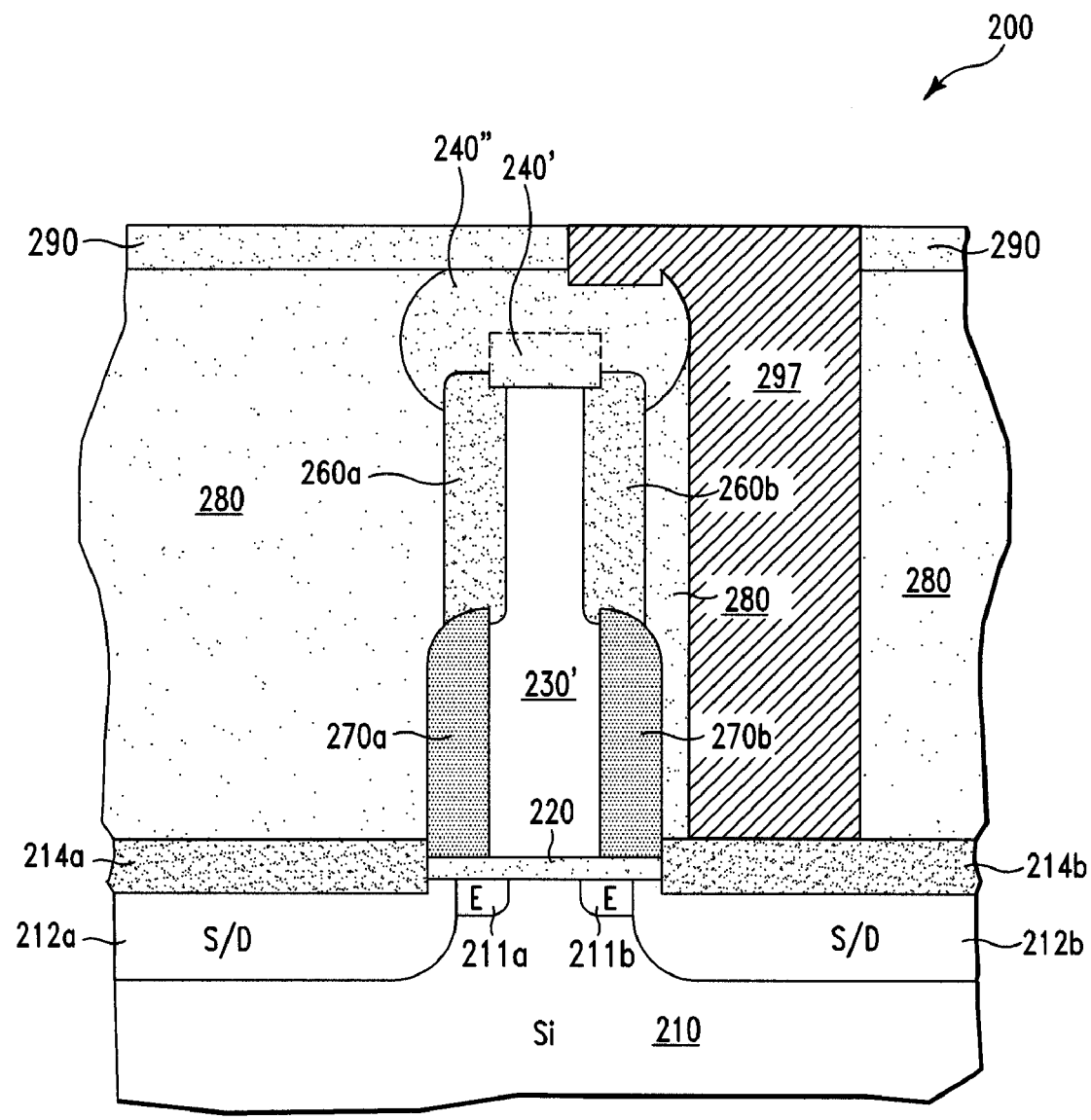

Next, with reference to FIG. 2F, in one embodiment, an oxide layer 290 is formed on top of the entire structure 200 of FIG. 2E. Next, a metal-filled contact hole 297 similar to the W-filled contact hole 197 of FIG. 1I is formed in the oxide layer 290 and the low-K dielectric layer 280. In one embodiment, the metal-filled contact hole 297 comprises tungsten (W) and the formation of the W-filled contact hole 297 is similar to the formation of the W-filled contact hole 197 of FIG. 1I.

It should be noted that, because the gate region 230',260a, 260b is completely in a shadow of the protection umbrella region 240", the gate silicide spacer 260b is not exposed to the surrounding ambient when the contact hole 297 is created in the oxide layer 290 and the low-K dielectric layer 280. As a result, the W-filled contact hole 297 is electrically insulated from the gate region 230',260a,260b by the low-K dielectric layer 280.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure formation method, comprising:
   providing a structure including:
   (a) a semiconductor layer including (i) a channel region and (ii) first and second source/drain (S/D) regions, wherein the channel region is disposed between and electrically coupled to the first and second S/D regions,
   (b) a gate dielectric region in direct physical contact with the channel region via an interfacing surface which defines a reference direction perpendicular to the interfacing surface, wherein the gate dielectric region is above the channel region in the reference direction,
   (c) a gate region in direct physical contact with the gate dielectric region, wherein the gate dielectric region is sandwiched between and electrically insulates the gate region and the channel region, and
   (d) a hard cap region on the gate region;
   forming a protection umbrella region from the hard cap region such that the gate region is completely in a shadow of the protection umbrella region, wherein the shadow of the protection umbrella region comprises a space shielded by the protection umbrella region from an imaginary light point source (i) directly above the protection umbrella region in the reference direction and (ii) infinitely far from the protection umbrella region;
   blanket depositing an inter-level dielectric (ILD) layer on the structure after said forming the protection umbrella region is performed;
   creating a contact hole in the ILD layer directly above the second S/D region and aligned with an edge of the protection umbrella region, wherein the contact hole is physically isolated from the gate region by the ILD layer; and
   filling the contact hole with an electrically conducting material,
   wherein the protection umbrella region comprises silicon dioxide, and
   wherein the ILD layer comprises a low-K dielectric material, wherein K <3.5.

2. A structure formation method, comprising:
   providing a structure including:
   (a) a semiconductor layer including (i) a channel region and (ii) first and second source/drain (S/D) regions, wherein the channel region is disposed between and electrically coupled to the first and second S/D regions,
   (b) a gate dielectric region in direct physical contact with the channel region via an interfacing surface which defines a reference direction perpendicular to the interfacing surface, wherein the gate dielectric region is above the channel region in the reference direction,
   (c) a gate region in direct physical contact with the gate dielectric region, wherein the gate dielectric region is sandwiched between and electrically insulates the gate region and the channel region, and
   (d) a hard cap region on the gate region;
   forming a protection umbrella region from the hard cap region such that the gate region is completely in a shadow of the protection umbrella region, wherein the shadow of the protection umbrella region comprises a space shielded by the protection umbrella region from an imaginary light point source (i) directly above the protection umbrella region in the reference direction and (ii) infinitely far from the protection umbrella region;
   blanket depositing an inter-level dielectric (ILD) layer on the structure after said forming the protection umbrella region is performed;
   creating a contact hole in the ILD layer directly above the second S/D region and aligned with an edge of the protection umbrella region, wherein the contact hole is physically isolated from the gate region by the ILD layer; and
   filling the contact hole with an electrically conducting material,
      wherein said forming the protection umbrella region from the hard cap region comprises selectively depositing a dielectric material on only the hard cap region, wherein the hard cap region comprises silicon dioxide, and wherein the dielectric material comprises silicon dioxide.

3. A structure formation method, comprising:
providing a structure including:
  (a) a semiconductor layer including (i) a channel region and (ii) first and second source/drain (S/D) regions, wherein the channel region is disposed between and electrically coupled to the first and second S/D regions,
  (b) a gate dielectric region in direct physical contact with the channel region via an interfacing surface which defines a reference direction perpendicular to the interfacing surface, wherein the gate dielectric region is above the channel region in the reference direction,
  (c) a gate region in direct physical contact with the gate dielectric region, wherein the gate dielectric region is sandwiched between and electrically insulates the gate region and the channel region, and
  (d) a hard cap region on the gate region;
forming a protection umbrella region from the hard cap region such that the gate region is completely in a shadow of the protection umbrella region, wherein the shadow of the protection umbrella region comprises a space shielded by the protection umbrella region from an imaginary light point source (i) directly above the protection umbrella region in the reference direction and (ii) infinitely far from the protection umbrella region;
blanket depositing an inter-level dielectric (ILD) layer on the structure after said forming the protection umbrella region is performed;
creating a contact hole in the ILD layer directly above the second S/D region and aligned with an edge of the protection umbrella region, wherein the contact hole is physically isolated from the gate region by the ILD layer; and
filling the contact hole with an electrically conducting material,
  wherein said creating the contact hole comprises etching the ILD layer using a blocking mask including the protection umbrella region, and
  wherein said etching the ILD layer comprises:
forming an oxide layer on the ILD layer;
creating an opening in the oxide layer; and
etching the ILD layer through the opening using the oxide layer and the protection umbrella region as the blocking mask.

4. A structure formation method, comprising:
providing a structure including:
  (a) a semiconductor layer including (i) a channel region and (ii) first and second source/drain (S/D) regions, wherein the channel region is disposed between and electrically coupled to the first and second S/D regions,
  (b) a gate dielectric region in direct physical contact with the channel region via an interfacing surface which defines a reference direction perpendicular to the interfacing surface, wherein the gate dielectric region is above the channel region in the reference direction,
  (c) a gate region in direct physical contact with the gate dielectric region, wherein the gate dielectric region is sandwiched between and electrically insulates the gate region and the channel region, and wherein the gate region comprises (i) a polysilicon region on and in direct physical contact with the gate dielectric region and (ii) first and second gate silicide regions on first and second sidewalls of the polysilicon region, respectively;
  (d) a hard cap region on the gate region; forming a protection umbrella region from the hard cap region such that the gate region is completely in a shadow of the protection umbrella region, wherein the shadow of the protection umbrella region comprises a space shielded by the protection umbrella region from an imaginary light point source (i) directly above the protection umbrella region in the reference direction and (ii) infinitely far from the protection umbrella region;
blanket depositing an inter-level dielectric (ILD) layer on the structure after said forming the protection umbrella region is performed;
creating a contact hole in the ILD layer directly above the second S/D region and aligned with an edge of the protection umbrella region, wherein the contact hole is physically isolated from the gate region by the ILD layer, and wherein said creating the contact hole comprises (i) forming an oxide layer on the ILD layer, (ii) creating an opening in the oxide layer, and, (ii) etching the ILD layer through the opening using the oxide layer and the protection umbrella region as a blocking mask; and
filling the contact hole with an electrically conducting material.

5. The method of claim 4,
wherein the protection umbrella region comprises silicon dioxide, and
wherein the ILD layer comprises a low-K dielectric material, wherein K <3.5.

6. The method of claim 4, wherein the electrically conducting material comprises tungsten.

7. The method of claim 4, wherein said forming the protection umbrella region from the hard cap region comprises selectively depositing a dielectric material on only the hard cap region.

* * * * *